United States Patent [19]

Yamada

[11] Patent Number: 5,150,185
[45] Date of Patent: Sep. 22, 1992

[54] SEMICONDUCTOR DEVICE

[75] Inventor: Hiroshi Yamada, Atsugi, Japan

[73] Assignee: Fujitsu Limited, Kawasaki, Japan

[21] Appl. No.: 684,385

[22] Filed: Apr. 12, 1991

[30] Foreign Application Priority Data

Apr. 18, 1990 [JP] Japan ............... 2-102143
Sep. 19, 1990 [JP] Japan ............... 2-249088

[51] Int. Cl.$^5$ ............... H01L 29/72; H01L 29/161; H01L 27/12; H01L 29/12
[52] U.S. Cl. ............... 357/34; 357/16; 357/4; 357/58; 357/61
[58] Field of Search ............... 357/34, 16, 4, 90, 58, 357/61

Primary Examiner—Mark V. Prenty
Attorney, Agent, or Firm—Staas & Halsey

[57] ABSTRACT

A semiconductor device comprises an n-type emitter layer, a p-type base layer formed in contact with the n-type emitter layer, a first collector layer formed in contact with the base layer, and having a bandgap substantially equal to that of the p-type base layer, and a second collector layer formed in contact with the first collector layer, and having a bandgap wider than that of the first collector layer, the first collector layer having such a thickness that kinetic energy of electrons injected from the p-type base layer and flowing in the first collector layer is substantially 1.0 to 1.5 times the bandgap of the first collector layer at an interface between the first collector layer and the second collector layer. Electrons injected into the base layer can flow at very high speed in the first collector layer, because the first collector layer has a narrow bandgap. In addition, the avalanche breakdown never takes place in the first collector layer, because kinetic energy of the electrons is lower than substantially 1.0 to 1.5 times the bandgap of the first collector layer.

32 Claims, 7 Drawing Sheets

SEMICONDUCTOR DEVICE

BACKGROUND OF THE INVENTION

The present invention relates to a semiconductor device, particularly a heterojunction bipolar transistor.

Generally the bipolar transistor uses Si (silicon) as a material, but Si puts a physical limitation to the speedup of the bipolar transistor. In such circumstances, it is wished that a bipolar transistor using materials which are more effective for the speedup thereof will be developed. Such bipolar transistor is a heterojunction bipolar transistor (HBT) or the like having a base and a collector which are made of compound semiconductors, Ge (germanium) or others.

The HBT can have good emitter-base electron injection efficiency by using the heterojunction between the emitter and the base. In addition, the doping of the emitter layer and the base layer is not limited, and the design freedom is accordingly high. Consequently it is possible to make a device design suitable for speedup.

In this sense, the HBT is much expected to break the deadlock, it is said Si bipolar transistors have encountered in terms of speedup. Especially the HBT made of compound semiconductors is advantageous to ultraspeedup because of its superior electron transport characteristic in the base layer and the depletion layer of the collector layer and, in addition, further expands the design freedom including the band structure. This HBT is being vigorously studied.

There is a tendency that compound semiconductors are more effective for the speedup of the bipolar transistor as they have lower bandgap energy Eg. The bandgap energy Eg of InGaAs is about half that of GaAs. It is very effective for the speedup of the bipolar transistor to make the base and the collector of compound semiconductors having such narrow bandgaps. But on the other hand, the voltage resistance between the base and the collector is adversely lowered, which resultantly causes troubles to the circuit operation, etc. In view of this, the high base-collector breakdown-voltage is needed.

In the bipolar transistor, the breakdown voltage between the base and the collector is determined by the breakdown of a p-n junction between the base and the collector. For the occurrence of this breakdown, both the tunnel effect and the avalanche effect are important mechanisms, and usually the avalanche effect determines the breakdown voltage.

That is, as shown in the base-collector band structure of FIG. 1, electrons injected from a base layer 102 into a collector depletion region 104 have high kinetic energy Ek, exposed to an intense electoric field or others, and collide with lattice atoms. As the electrons flow further to the collector layer 106, the kinetic energy Ek of these electrons increases. When the kinetic energy Ek has an intensity which excites the electrons from the valence band to the conduction band, or excites holes from the conduction band to the valence band, i.e., becomes high enough to jump a bandgap Eg, bonds of the lattice atoms are cut to generate electron-hole pairs. These generated electrons and holes have energy, exposed to the electric field and generate different new electron-hole pairs. This process repeatedly takes place to cause an avalanche effect, and the p-n junction between the base and the collector is broken.

To suppress the occurrence of the breakdown caused by the avalanche effect, the bandgap Eg in the depletion region of the p-n junction is made large.

That is, as shown in the base-collector band structure of FIG. 2, a collector layer 112 is made of a semiconductor material having a wider bandgap Eg than that of a base layer 110. For the prevention of spikes of the band Ec between the base layer 110 and the collector layer 112, there is provided a graded layer 114 having a gradually changing bandgap. The other side of the collector layer 112, whose bandgap is wider, is jointed to a sub-collector layer 118 with a narrower bandgap doped with a high concentration of an impurity through a graded layer 116 with a gradually changing bandgap doped with a high concentration of an impurity.

In the case the base layer 110 is made of, e.g., Ge, the collector layer 112 is made of SiGe or others. In the case the base layer 110 is made of, e.g., InGaAs, the collector layer 112 is made of InAlAs or others.

But for the purpose of realizing high breakdown-voltage of the collector, it is contrary to the intention of realizing the speedup of the bipolar transistor by making the base and the collector of semiconductor materials having narrow bandgaps to make, as conventionally done, the collector layer of semiconductor materials having wide bandgaps. In other words, the base layer alone is made of a semiconductor material with a narrow bandgap, and accordingly the speedup of the operation of the bipolar transistor cannot be realized. Thus, the realization of high breakdown-voltage of the collectors by the conventional method involves a problem that the speedup of the bipolar transistor has to be sacrificed.

In the case the base layer is made of InGaAs, and the collector layer is made of InAlAs, since an energy level difference $\Delta E_{\Gamma\text{-}L}$ between $\Gamma$-valley and L-valley in InAlAs is relatively as small as 0.23 eV, electrons injected from the base layer into the collector layer to easily transferred from $\Gamma$-valley to L-valley, so, velocity overshoot is not so effective with the result of decrease of the velocity of the electrons. Accordingly the increase of the velocity of the electrons due to the velocity overshoot effect cannot be realized, and it is a problem that the speedup of the bipolar transistor cannot be realized.

On the other hand, the HBT using AlGaAs/GaAs heterojunction out of various compound semiconductors has been much studied also because of its easily controllable crystal growth. As a result this HBT has the fastest switching speed record of the presently used semiconductor devices.

What is more important in terms of the design of the device structure for further super-speedup is to reduce a transit time in the base layer and the collector depletion layer as well as reduction of parasitic capacitance and parasitic resistance. The reduction of a transit time in the base layer is realized by, e.g., thinning the base layer and grading the base layer, and the reduction of a transit time in the collector depletion layer is realized by optimizing the electric field in the depletion layer by using a p-type collector, an i-type collector or the structure of a BCT (Ballistic Collection Transistor).

FIG. 3 shows band structures and layer structures of a usual HBT. FIG. 4 shows band structures and layer structures of a BCT using i/p+/n+ structure as the high-speed collector structures.

These HBT and BCT are common in n-type emitter layers 122, 132, and p+-type base layers 124, 134, but an n-type collector layer 126 of the HBT corresponds to a collector layer of the BCT comprising an i-type layer 136, p+-type planar doped layer 138 and an n+-type layer 140.

In the i/p+/n+ multi-layer collector structure of the BCT, the electric field in the i-type layer 136 is optimized by adjusting the concentration of the p+-type planar doped layer 138 so that electrons velocity-overshoot and transit "quasi-ballistically" in the entire region of the i-type layer 136 having a lower concentration of an impurity.

That is, in the HBT of FIG. 3 having the usual n-type collector structure, electrons injected from the p+-type base layer 124 into the n-type collector layer 126 are immediately injected into the L-valley, while in the BCT of FIG. 4 having the i/p+/n+ multi-layer collector structure, electrons velocity-overshoot in almost the entire region of the collector layer within a certain collector voltage Vce, and now the electrons can quasi-ballistically transit in the Γ-valley where the transit speed is higher than that in the L-valley. Accordingly by using the i/p+/n+ multi-layer collector structure, the electron transit time mainly causing the retardation of the device, especially the electron transit time in the collector depletion layer can be decreased.

For example, a report says that the i/p+/n+ multi-layer collector structure was adapted to the HBT using AlGaAs/GaAs heterojunction, whereby a maximum cut-off frequency of 105 GHz was realized (T. Ishibashi et al., "ULTRA-HIGH SPEED AlGaAs/GaAs HETEROJUNCTION BIPOLAR TRANSISTOR", 1988 International Electron Devices Meeting TECHNICAL DIGEST, pp 826-829). This report have evidenced the utility of this structure.

But, in the case the base layer is made of GaAs, a turn-on voltage becomes high, and accordingly the source voltage becomes high, power consumption becoming large. Thus it is difficult to integrate many HBTs.

On the other hand, a HBT using the InAlAs/InGaAs or InP/InGaAs systems having base layers made of InGaAs with a narrow bandgap, have, in comparison with the HBT having base layers made of GaAs, higher electron mobility and higher speed, and also lower turn-on voltage and accordingly low power consumption.

Here, for lower power consumption, when the above-mentioned BCT structure is applied to the HBT having a base layer with a narrow bandgap, such as the InAlAs/InGaAs HBT or the InP/InGaAs HBT, the collector structure of the HBT becomes the i-type InGaAs/p+-type InGaAs/n+-type InGaAs system. InGaAs has such a high electron mobility and a large energy difference between the Γ-valley and the L-valley that the velocity-overshoot works more effectively.

Thus, it is considered very effective for the speedup to apply the BCT structure having an i/p+/n+ multi-layer collector to the HBT having the InGaAs base with a narrow bandgap.

As above described, though it is very effective to the speedup to apply the BCT structure having an i/p+/n+ multi-layer collector to the HBT having the InGaAs base with a narrow bandgap, it causes the following problem.

That is, as seen in FIG. 4, the electric field in the depletion layer between p+-type planar doped layer 138 and a n+-collector layer 140 is more intense than that in the collector depletion layer of the usual collector structure. Accordingly the breakdown voltage of this collector structure is determined by a p+-n+ junction between the p+-type planar doped layer 138 and the n+-type collector layer 140 and is lower than that of the usual collector structure.

Furthermore, in the case InGaAs with a narrow bandgap is used in the base layer, it is usual to make the collector layer of InGaAs. Narrow bandgap semiconductors such as InGaAs, whose ionization ratio is high, tend to cause the avalanche effect and also the tunnel effect. The collector breakdown voltage is further lowered in the case the collector layer is made of semiconductor with a narrow bandgap.

Thus, the problem is that the decrease of the breakdown voltage characteristic of the collector greatly limits the circuit structure, making the circuitry operation difficult.

As a solution of this problem, it can be proposed to use a double heterostructure for widening the bandgap of the collector layer in the case the base layer is made of a narrow bandgap semiconductor, but the transit time of electrons in the collector depletion layer is accordingly impaired, sacrificing the speedup.

SUMMARY OF THE INVENTION

An object of the present invention is to provide a semiconductor device which can realize high base-collector breakdown voltage while realizing high speed operations.

The object of the present invention is achieved by a semiconductor device comprising: an emitter layer; a first conduction type base layer formed in contact with the emitter layer; a first collector layer formed in contact with the first conduction type base layer, and having a bandgap substantially equal to that of the first conduction type base layer; and a second collector layer formed in contact with the first collector layer, and having a bandgap wider than that of the first collector layer, the first collector layer having such a thickness that kinetic energy of carriers injected from the first conduction type base layer and flowing in the first collector layer is substantially equal to or higher than the bandgap of the first collector layer at an interface between the first collector layer and the second collector layer and is sufficient not to cause an avalanche breakdown.

According to the present invention, since the first collector layer as well as the first conduction type base layer has a narrow bandgap, carriers injected into the base layer can flow at very high speed in the first collector layer. In addition, since kinetic energy Ek of the carriers is higher than the bandgap of the first collector layer and is substantially equal to or higher than the bandgap of the first collector layer at an interface between the first collector layer and the second collector layer and is sufficient not to cause an avalanche breakdown, the avalanche breakdown never takes place in the first collector layer.

Furthermore, since the bandgap Eg of the second collector layer widens from the interface thereof with the first collector layer, kinetic energy Ek of carriers injected from the first collector layer into the second collector layer is substantially 1.0 to 1.5 times or lower than the bandgap of the second collector layer at positions in the second collector layer. Accordingly the avalanche effect never takes place in the second collector layer either. Thus high breakdown-voltage of the collectors can be realized.

Also, the object of the present invention is achieved by a semiconductor device comprising: an emitter layer; a first conduction type base layer formed in contact with the emitter layer; a first collector layer formed in contact with the first conduction type base layer, and having a bandgap substantially equal to that of the first conduction type base layer and higher than kinetic energy of carriers injected from the first conduction type base layer and flowing in the first collector layer; a second collector layer formed in contact with the first collector layer, planar-doped first conduction type, and having a bandgap higher than kinetic energy of carriers flowing in the second collector layer; and a second conduction type third collector layer formed in contact with the second collector layer, and having a bandgap higher than that of the first collector layer and higher than kinetic energy of carriers flowing in the third collector layer.

In the semiconductor device according to the present invention, the electric field in the first collector layer is set by a difference in impurity concentration between the base layer and the second collector layer. The difference can be so set that the effect of carrier velocity-overshoot in the first collector layer is maximum in its operational state. Consequently, carriers injected from the base layer into the collector layer can transit in a velocity-overshooting condition quasi-ballistically in the Γ-valley where their transit speed is higher. Resultantly ultra-high speed operations can be realized.

The second collector layer and the third collector layer are partially depleted by the p-n junction. But because the third collector layer has a wide bandgap, even when transiting carriers are given kinetic energy by the electric field, the avalanche effect can be prevented.

Thus, ultra-high speed, low power consumption, and high breakdown-voltage which is necessary for the operation of circuits can be realized.

DETAILED DESCRIPTION OF THE INVENTION

The semiconductor device according to a first embodiment of the present invention will be explained in good detail using FIGS. 5 and 6.

Figure 1:
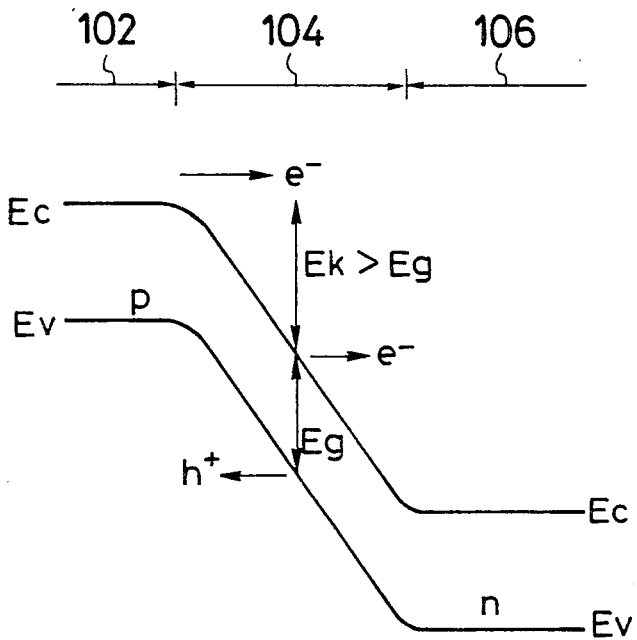
FIG. 1 is an energy band diagram for explaining one of conventional semiconductor devices.
Figure 2:
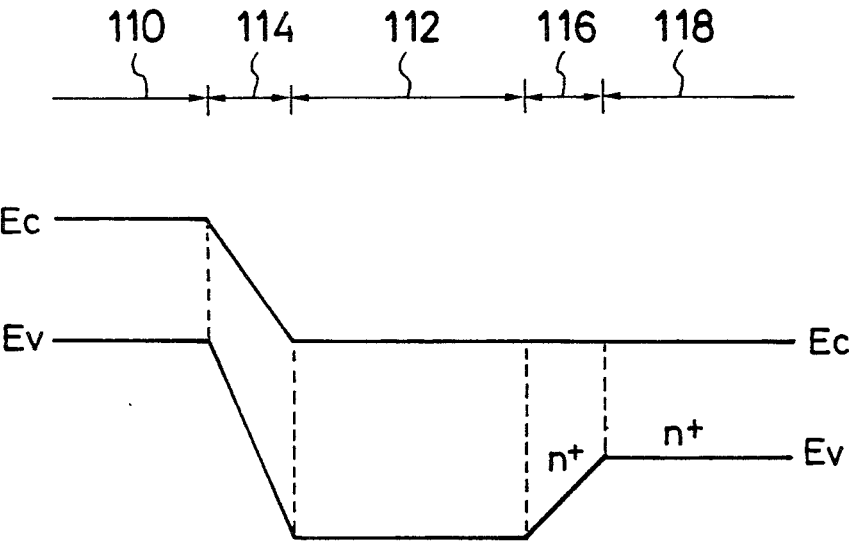
FIG. 2 is an energy band diagram for explaining another of conventional semiconductor devices.
Figure 3:
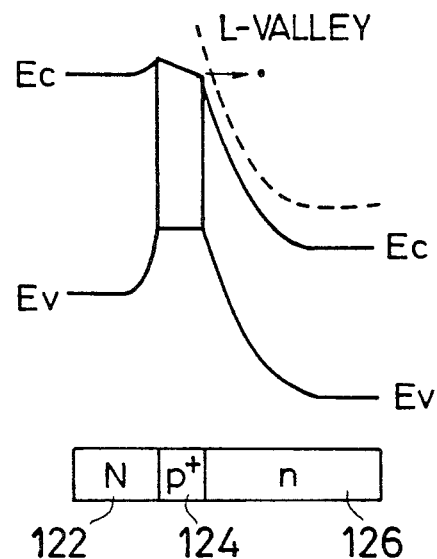
FIG. 3 is an energy band diagram for explaining a conventional HBT.
Figure 4:
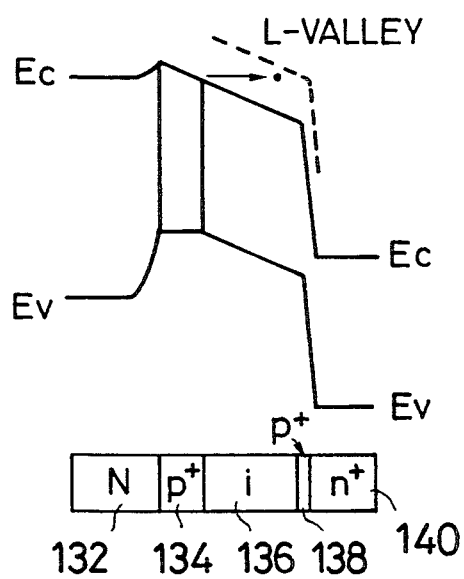
FIG. 4 is an energy band diagram for explaining of a conventional BCT.
Figure 5:
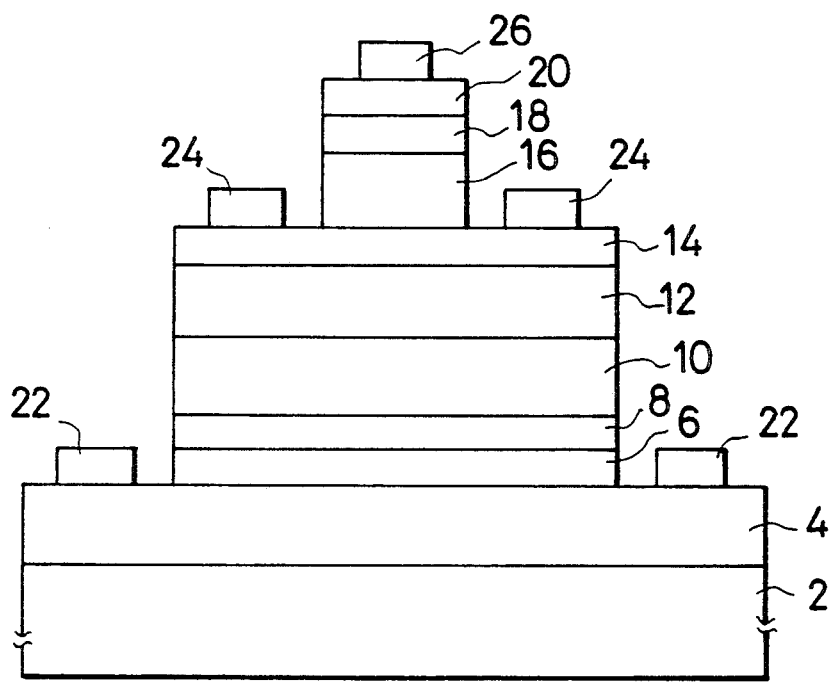
FIG. 5 is a sectional view of the semiconductor device according to a first embodiment of the present invention.

FIG. 5 shows a sectional view of the semiconductor device according to the first embodiment.

An $n^+$-InGaAs sub-collector layer 4 with thickness of 500 nm is formed on an InP substrate 2. On this sub-collector layer 4, a quaternary alloy $n^+$-$(InGaAs)_{0.4}(InAlAs)_{0.6}$ wide-bandgap collector layer 8 with thickness of 50 nm is formed through a quaternary alloy $n^+$-$(InGaAs)_{1-x}(InAlAs)_x$ graded layer 6 with thickness of 50 nm. InAlAs mole fraction x of the graded layer 6 varies from 0 to 0.6 continuously from the interface thereof with the sub-collector layer 4 to the interface thereof with the wide bandgap-collector layer 8.

A quaternary alloy i-$(InGaAs)_{1-x}(InAlAs)_x$ breakdown-resistant collector layer 10 with thickness of 100 nm is formed on the wide-bandgap collector layer 8. On this breakdown-resistant collector layer 10 is formed an i-InGaAs high electron mobility collector layer 12 with thickness of 150 nm. On the high electron mobility collector layer 12 is formed a $p^+$-InGaAs base layer 14 with thickness of 50 nm. InAlAs mole fraction x of the breakdown-resistant collector layer 10 varies from 0.6 to 0 continuously from the interface thereof with the wide bandgap collector layer 8 to the interface thereof with the high electron mobility collector layer 12.

An n-InAlAs emitter layer 16 with thickness of 200 nm is formed on the base layer 14. On this emitter layer 16 is formed an $n^+$-InGaAs cap layer 20 with thickness of 50 nm through a quaternary alloy $n^+$-$(InGaAs)_{1-x}(InAlAs)_x$ graded layer 18 with thickness of 50 nm.

Collector electrodes 22, base electrodes 24, and an emitter electrode 26 are provided respectively on the sub-collector layer 4, the base layer 14 and the cap layer 20.

Thus is formed an InAlAs/InGaAs HBT having an emitter provided by the InAlAs emitter layer 16, a base provided by the InGaAs base layer 14, and a collector provided by the InGaAs highly electron mobility collector layer 12, by the $(InGaAs)_{1-x}(InAlAs)_x$ breakdown-resistant collector layer 10 and by the $(InGaAs)_{0.4}(InAlAs)_{0.6}$ wide bandgap collector layer 8.

Next, the operation of this HBT will be explained with reference to FIG. 6.

Figure 6:
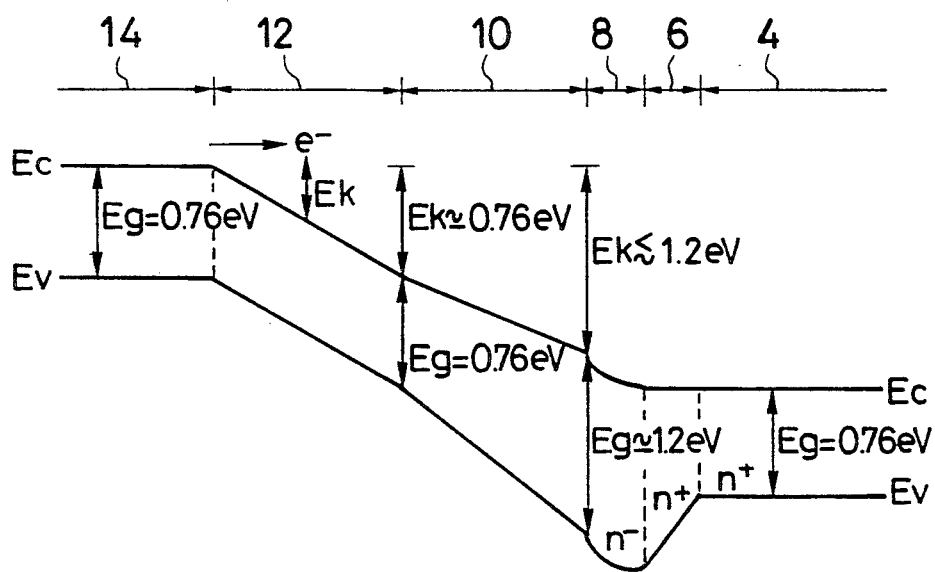
FIG. 6 is an energy band diagram for explaining the operation of the semiconductor device shown in FIG. 5.

FIG. 6 shows the energy band structure of the base-collector of the semiconductor device of FIG. 5 in operation.

The bandgaps Eg of the $p^+$-InGaAs base layer 14 and the i-InGaAs high electron mobility collector layer 12 are 0.76 eV. The bandgap Eg of the i-$(InGaAs)_{1-x}(InAlAs)_x$ breakdown voltage collector layer 10 is a gradually changing bandgap which increases continuously from 0.76 eV at the interface thereof with the high electron mobility collector layer 12 to around 1.2 eV at the interface thereof with the wide bandgap collector layer 8 in accordance with the change of InAlAs mole fraction x.

The bandgap Eg of the $n^+$-$(InGaAs)_{0.4}(InAlAs)_{0.6}$ wide bandgap collector layer 8 is around 1.2 eV but has a bending due to a high concentration of n+-doping. The bandgap Eg of the $n^+$-$(InGaAs)_{1-x}(InAlAs)_x$ graded layer 6 is a gradually changing bandgap which decreases continuously from around 1.2 eV at the interface thereof with the wide bandgap collector layer 8 to 0.76 eV at the interface thereof with the sub-collector layer 4 in accordance with InAlAs mole fraction x. The bandgap Eg of the n+-InGaAs sub-collector 4 is 0.76 eV.

In the operational state with a required voltage applied between the base electrodes 24 and the collector electrodes 22, electrons are injected from the base layer 14 and flow toward the wide bandgap layer 8.

In the high electron mobility collector layer 12, because of high mobility of the electrons due to its bandgap as narrow as 0.76 eV, the electrons flow at very high speed. Here it is assumed that the electrons flow "quasi-ballistically" during their flow in the collector layer 12, the electrons receive kinetic energy Ek corresponding to a energy level by which the conduction band Ec lowers from the base layer 14. Consequently in the high electron mobility collector layer 12, the kinetic energy of the electrons is always lower than the bandgap Eg=0.76 eV and substantially equal to the bandgap Eg=0.76 eV at the interface thereof with the breakdown-resistant collector layer 10. Accordingly in the high electron mobility collector layer 12 the electrons flow at high speed without causing the avalanche effect.

Next, in the breakdown-resistant collector layer 10, its bandgap Eg increases continuously from 0.76 eV at the interface thereof with the high electron mobility collector layer 12 to around 1.2 eV at the interface thereof with the wide bandgap collector layer 8. Although kinetic energy of the electrons flowing in the breakdown-resistant layer 10 becomes gradually higher, the bandgap of the breakdown-resistant collector layer 10 is always lower than the kinetic enery of the electrons. Consequently the electrons flow in the breakdown-resistant collector layer 10 without causing the avalanche effect.

In the wide bandgap collector layer 8, its thickness is as thin as 50 nm but is heavily doped to be n+-type. Consequently an expansion of the depletion layer due to an base-collector applied voltage is accomodated in the wide bandgap collector layer 8, spaced a little from the interface of the breakdown-resistant collector layer 10. Accordingly decrease of the electron velocity due to the wide bandgap is not so effective to transit time.

In this embodiment, because not only the base layer 14 but also the high electron mobility collector layer 12 are made of InGaAs with narrow bandgaps, which is superior in electron mobility, electrons injected from the emitter layer 16 are allowed to flow at very high speed in the base layer 14 and the high electron mobility collector layer 12, and the bipolar transistor can be operative at high speed.

Especially the high electron mobility collector layer 12 not only has InGaAs with higher electron mobility, but also has an energy difference $\Delta E_{\Gamma\text{-}L}$ between the Γ-valley and the L-valley relatively as high as 0.53 eV in comparison with InAlAs. This enables the electron velocity overshooting effect to be realized. Furthermore this is very effective to realize the speedup of the bipolar transistor.

In the breakdown-resistant collector layer 10, the gradually changing bandgap Eg is continuously widened in the direction of flow of electrons. Its bandgap is higher at respective positions thereof than kinetic energy Ek of the electrons flowing there, which allows the electrons flowing in the breakdown-resistant collector layer 10 to flow therethrough without the avalanche breakdown. Consequently high breakdown-voltage of the collector can be realized.

Actually the electrons flowing in the breakdown-resistant collector layer 10 do not flow "quasi-ballistically" and dispersed by the L-valley, etc., losing the kinetic energy Ek. Consequently the breakdown voltage can be made higher than the bandgap Eg widening in the direction of flow of electrons.

Since the wide bandgap collector layer 8 is heavily doped to be n+-type, the expansion of the depletion layer can be confined within the wide bandgap collector layer 8. Consequently the breakdown voltage of the collector can be improved, and at the same time the decrease of mobility due to a wide bandgap little affects the electrons flowing through the wide bandgap collector layer 8.

In the above-described embodiment, the high electron mobility collector layer 12 is preferablly more thick for reducing the transit time. But when the collector layer 12 is thick to excess, the kinetic energy Ek of electrons is too high to suppress the occurrence of the breakdown causes by the avalanche breakdown, with the breakdown voltage decreasing. Thus the thickness of the collector layer 12 is preferably the upper limit without causing the breakdown.

The bandgap of the breakdown-resistant collector layer 10 changes gradually higher from the interface thereof with the high electron mobility collector layer 12. It is preferable for higher electron mobility and for reducing the transit time that the bandgap of the breakdown-resistant collector layer 10 changes more slightly. But when changes in the bandgap of the breakdown-resistant collector layer 10 are very slight, the kinetic energy Ek of electrons is too high to suppress the occurrence of the breakdown causes by the avalanche breakdown, with the breakdown voltage decreasing. Thus the bandgap of the breakdown-resistant collector layer 10 is preferably the lower limit without causing the breakdown.

First, the limits of the kinetic energy Ek of electrons for the bandgap Eg without causing the avalanche breakdown to the breakdown will be explained below. The upper limit of the kinetic energy Ek for the bandgap Eg can be written in the form:

$$Ek = (2mn + mp)/(mn + mp) \times Eg$$
$$= (1 + mn/(mn + mp)) \times Eg$$

where mn is effective mass of an electron, mp effective mass of a hole. For mn=mp, Ek=1.5 Eg, and for mn<<mp, Ek=Eg (see Karlheinz Seeger, "SEMICONDUCTOR PHYSICS", Springer-Verlag, New York, 1973, p.328). Thus the limits of the kinetic energy Ek of electrons without causing the avalanche breakdown are given by $$Eg < Ek < 1.5 \, Eg.$$

Accordingly, the thickness of the high electron mobility collector layer 12 is determined so that the kinetic energy Ek of electrons flowing in the high electron mobility collector layer 12 is below 1.0 to 1.5 times the bandgap thereof. The changes in the bandgap of the breakdown-resistant collector layer 10 is determined so that the kinetic energy Ek of electrons flowing in the breakdown-resistant collector layer 10 is below 1.0 to 1.5 times the bandgap thereof.

A preferable thickness range of the high electron mobility collector layer 12 will be explained in detail.

Electrons injected from a base to a collector are accelerated by voltage applied between the base and the collector. The kinetic energy of electrons flowing in the collector differs depending on the voltage applied between the base and the collector. Thus the preferable thickness range of the high electron mobility collector layer 12 differs depending on the voltage.

Figure 7:
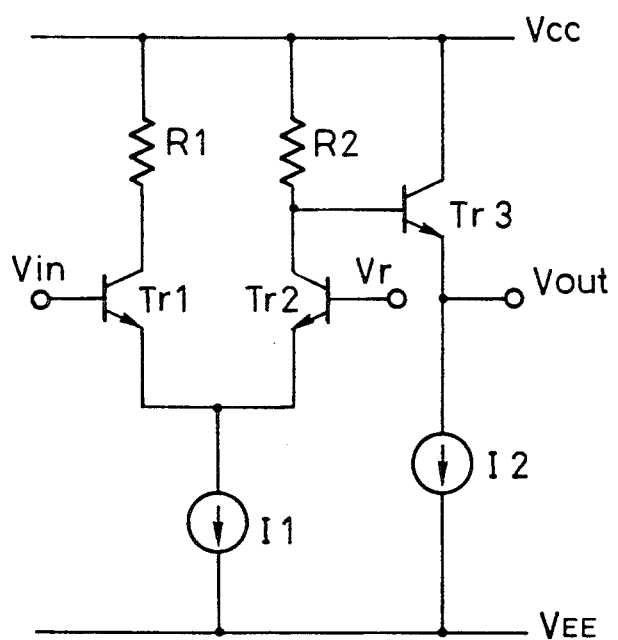
FIG. 7 is a circuit diagram of an ECL gate using HBTs according to the present invention.

An ECL gate of FIG. 7 will be selected as a typical circuit using HBTs according to the present invention. In the ECL gate, a transistor Tr1 has a collector connected to a collector supply voltage $V_{CC}$ through a resistor R1, and a base connected to an input voltage Vin. A transistor Tr2 has a collector connected to VCC through a resistor R2, and a base connected to an reference voltage Vr. Emitters of the transistors Tr1 and Tr2 are commonly connected to an emitter supply voltage $V_{EE}$ through a constant current source I1. A transistor Tr3 has a collector connected to $V_{CC}$, a base connected to the collector of the transistor Tr2, and an emitter connected to $V_{EE}$ through a constant current source I2. An output voltage Vout is outputted from the emitter of the transistor Tr3.

Assuming that the reference voltage Vr is given by $$Vr = V_{CC} - Von - V\tfrac{1}{2}$$

where Von is a turn-on voltage of the HBT, and V1 a logic swing.

Collector-base voltages Vbc which are applied between the collectors and the bases of the transistor Tr1, Tr2, and Tr3 are as follows respectively.

When the input voltage Vin is high level, the transistor Tr1 turns on and Vbc=Von-V1, the transistor Tr2 turns off and Vbc=Von+V½, and the transistor Tr3 turns on and Vbc=0. When the input voltage Vin is low level, the transistor Tr1 turns off and Vbc=Von+V1, the transistor Tr2 turns on and Vbc=Von-V½, and the transistor Tr3 turns off and Vbc=V1.

The semiconductor device according to the first embodiment of the present invention is an InAlAs/InGaAs heterojunction bipolar transistor, which have the emitter layer 16 made of n-InAlAs, and the base layer 14 made of p+-InGaAs. A turn-on voltage Von of the InAlAs/InGaAs HBT is about 0.80 volts. Assuming that the logic swing V1=0.4 volts, the transistor Tr1 has Vbc=0.40-1.20 volts, the transistor Tr2 has Vbc=0.60-1.00 volts, and the transistor Tr3 has Vbc=0.00-0.40 volts. When the transistors Tr1, Tr2, and Tr3 turn on, Vbc is a maximum of 0.60 volts. When the transistors Tr1, Tr2, and Tr3 turn off, Vbc is a maximum of 1.20 volts.

Assuming that a high electron mobility collector layer 12 of the InAlAs/InGaAs HBT is i-type, is depleted completely, and is in an uniform electric field, an electric field Fc can be written in the form:

$$Fc = (Vbi + Vbc)/Wc$$

where Vbi is a build-in voltage between a base and a collector, Wc a width of the collector layer 12, and Eg a bandgap of the collector layer 12. Kinetic energy Ek of electrons flowing ballistically in the collector layer 12 at a position where is d distant from the interface thereof with the base layer 14 can be written in the form:

$$Ek = Fc \times d = \{(Vbi + Vbc)/Wc\} \times d.$$

Assuming Ek=n×Eg where n=1.0−1.5, the distance d is given by $$d = Wc \times Eg \times n/(Vbi + Vbc).$$

In the InAlAs/InGaAs HBT, Eg=0.76 eV, Wc=300 nm, and Vbi=0.883 volts (where the base layer 14 is p+ doped at $4 \times 10^{19}$ cm$^{-3}$ and the sub-collector layer 4 is n+ doped at $5 \times 10^{18}$ cm$^{-3}$). When the HBT turns on, the thickness d of the high electron mobility collector layer 12 is given by $$\begin{aligned} d &= 300 \times 0.76 \times n/(0.883 + 0.60) \\ &= 153.7 \times n \\ &= 153.7 - 230.6. \end{aligned}$$

When the HBT turns off, the thickness d of the high electron mobility collector layer 12 is given by $$\begin{aligned} d &= 300 \times 0.76 \times n/(0.883 + 1.20) \\ &= 109.4 \times n \\ &= 109.4 - 164.2. \end{aligned}$$

Thus the preferable thickness range of the high electron mobility collector layer 12 is 153.7–230.6 nm when the HBT turns on, or 109.4–164.2 nm when the HBT turns off.

The semiconductor device according to a second embodiment of the present invention will be explained in good detail using FIGS. 8 and 9.

Figure 8:
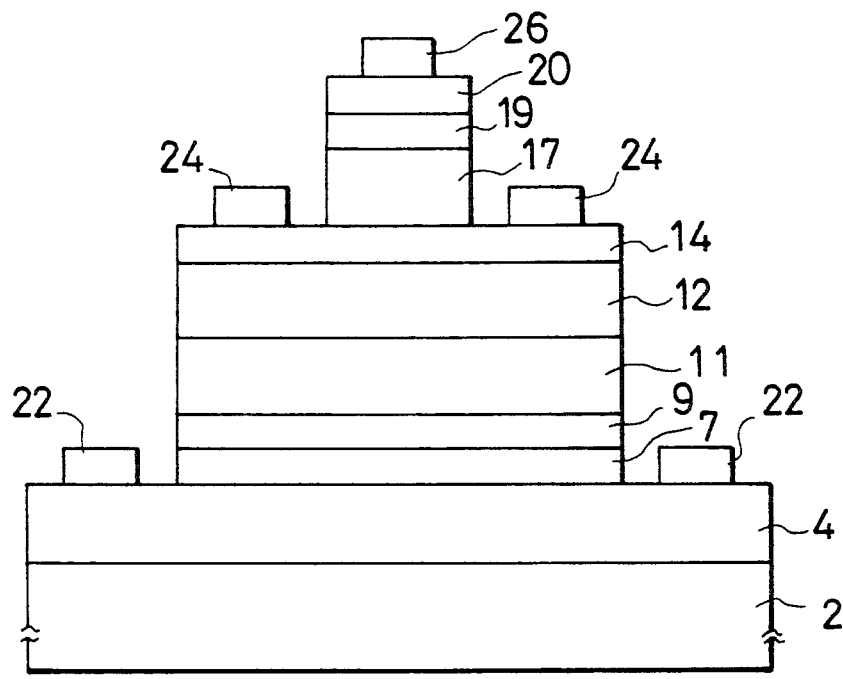
FIG. 8 is a sectional view of the semiconductor device according to a second embodiment of the present invention.

FIG. 8 shows a sectional view of the semiconductor device according to the second embodiment.

An n+-InGaAs sub-collector layer 4 with thickness of 300 nm is formed on an InP substrate 2. On this sub-collector layer 4, an n-InP wide-bandgap collector layer 9 with thickness of 50 nm is formed through a quaternary alloy n+-InGaAsP graded layer 7 with thickness of 50 nm. A fraction of the graded layer 7 varies continuously from the interface thereof with the sub-collector layer 4 to the interface thereof with the wide bandgap-collector layer 9.

A quaternary alloy i-InGaAsP breakdown-resistant collector layer 11 with thickness of 50 nm is formed on the wide-bandgap collector layer 9. On this breakdown-resistant collector layer 11 is formed an i-InGaAs high electron mobility collector layer 12 with thickness of 200 nm. On the high electron mobility collector layer 12 is formed a p+-InGaAs base layer 14 with thickness of 50 nm.

An n-InP emitter layer 17 with thickness of 200 nm is formed on the base layer 14. On this emitter layer 17 is formed an n+-InGaAs cap layer 20 with thickness of 50 nm through a quaternary alloy n+-InGaAsP graded layer 19 with thickness of 50 nm.

Collector electrodes 22, base electrodes 24, and an emitter electrode 26 are provided respectively on the sub-collector layer 4, the base layer 14 and the cap layer 20.

Thus is formed an InP/InGaAs HBT having a emitter provided by the InP emitter layer 17, a base provided by the InGaAs base layer 14, and a collector provided by the InGaAs high electron mobility collector layer 12, by the InGaAsP breakdown-resistant collector layer 11 and by the InP wide bandgap collector layer 9.

Next, the operation of this HBT will be explained with reference to FIG. 9.

Figure 9:
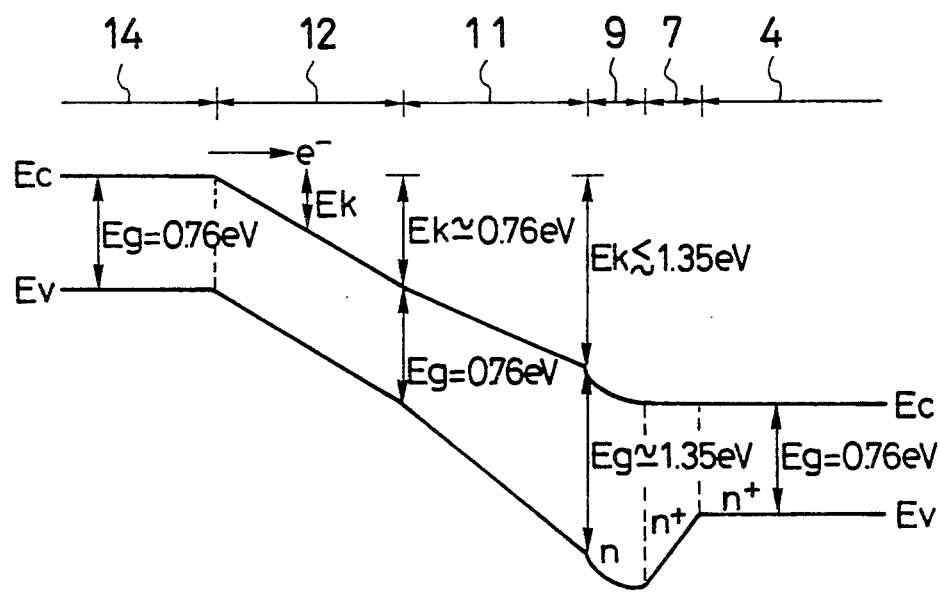
FIG. 9 is an energy band diagram for explaining the operation of the semiconductor device shown in FIG. 8.

FIG. 9 shows the energy band structure of the base-collector of the semiconductor device of FIG. 8 in operation.

The bandgaps Eg of the p+-InGaAs base layer 14 and the i-InGaAs high electron mobility collector layer 12 are 0.76 eV. The bandgap Eg of the i-InGaAsP breakdown voltage collector layer 11 is a gradually changing bandgap which increases continuously from 0.76 eV at the interface thereof with the high electron mobility collector layer 12 to around 1.35 eV at the interface thereof with the wide bandgap collector layer 9 in accordance with the change of mole fraction.

The bandgap Eg of the n-InP wide bandgap collector layer 9 is around 1.35 eV. The bandgap Eg of the n+-InGaAsP graded layer 7 is a gradually changing bandgap which decreases continuously from around 1.35 eV at the interface thereof with the wide bandgap collector layer 9 to 0.76 eV at the interface thereof with the sub-collector layer 4 in accordance with mole fraction. The bandgap Eg of the n+-InGaAs sub-collector 4 is 0.76 eV.

In the operational state with a required voltage applied between the base electrodes 24 and the collector electrodes 22, electrons are injected from the base layer 14 and flow toward the wide bandgap layer 9.

In the high electron mobility collector layer 12, because of high mobility of the electrons due to its bandgap as narrow as 0.76 eV, the electrons flow at very high speed. But in the high electron mobility collector layer 12 with thickness of 200 nm, the kinetic energy of the electrons is always lower than or substantially equal to the bandgap Eg=0.76 eV. Accordingly in the high electron mobility collector layer 12 the electrons flow at high speed without causing the avalanche breakdown.

Next, in the breakdown-resistant collector layer 11, its bandgap Eg increases continuously from 0.76 eV at the interface thereof with the high electron mobility collector layer 12 to around 1.35 eV at the interface thereof with the wide bandgap collector layer 9. Although kinetic energy of the electrons flowing in the breakdown-resistant layer 11 becomes gradually higher, the bandgap of the breakdown-resistant collector layer 11 is always higher than the kinetic enery of the electrons. Consequently the electrons flow in the breakdown-resistant collector layer 11 without causing the avalanche breakdown.

In this embodiment, because not only the base layer 14 but also the high electron mobility collector layer 12 are made of InGaAs with narrow bandgaps, which is superior in electron mobility, electrons injected from the emitter layer 17 are allowed to flow at very high speed in the base layer 14 and the high electron mobility collector layer 12, and the bipolar transistor can be operative at high speed.

In the breakdown-resistant collector layer 11, the gradually changing bandgap Eg is continuously widened in the direction of flow of electrons. Its bandgap is higher at respective positions thereof than kinetic energy Ek of the electrons flowing there, which allows the electrons flowing in the breakdown-resistant collector layer 11 to flow therethrough without the avalanche breakdown. Consequently high breakdown-voltage of the collector can be realized.

A preferable thickness range of the high electron mobility collector layer 12 of the InP/InGaAs HBT according to the second embodiment will be calculated by the same method as the HBT of the first embodiment.

A turn-on voltage Von of the InP/InGaAs HBT is about 0.80 volts. The transistor Tr1 has Vbc=0.35–1.15 volts, the transistor Tr2 has Vbc=0.55–0.95 volts, and the transistor Tr3 has Vbc=0.00–0.40 volts. When the transistors Tr1, Tr2, and Tr3 turn on, Vbc is a maximum of 0.55 volts. When the transistors Tr1, Tr2, and Tr3 turn off, Vbc is a maximum of 1.15 volts.

When the HBT turns on, the thickness d of the high electron mobility collector layer 12 is given by $$\begin{aligned} d &= 300 \times 0.76 \times n/(0.883 + 0.55) \\ &= 159.0 \times n \\ &= 159.0 - 238.7. \end{aligned}$$

When the HBT turns off, the thickness d of the high electron mobility collector layer 12 is given by $$\begin{aligned} d &= 300 \times 0.76 \times n/(0.883 + 1.15) \\ &= 112.1 \times n \\ &= 112.1 - 168.2. \end{aligned}$$

Thus the preferable thickness range of the high electron mobility collector layer 12 is 159.0–238.7 nm when the HBT turns on, or 112.1–168.2 nm when the HBT turns off.

The semiconductor device according to a third embodiment of the present invention will be explained in good detail using FIGS. 10 and 11.

Figure 10:
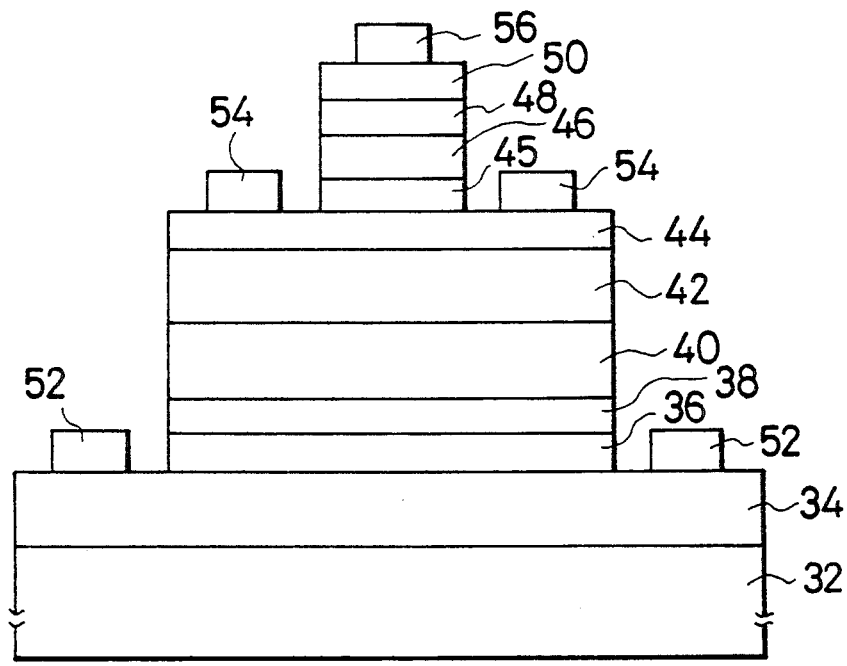
FIG. 10 is a sectional view of the semiconductor device according to a third embodiment of the present invention.

FIG. 10 shows a sectional view of the semiconductor device according to the third embodiment.

An n+-GaAs sub-collector layer 34 with thickness of 500 nm is formed on a GaAs substrate 32. On this sub-collector layer 34, a n−-Al$_{0.75}$Ga$_{0.25}$As wide-bandgap collector layer 38 with thickness of 100 nm is formed through a n+-Al$_x$Ga$_{1-x}$As graded layer 36 with thickness of 50 nm. AlAs mole fraction x of the graded layer 36 varies from 0.00 to 0.25 continuously from the interface thereof with the sub-collector layer 34 to the interface thereof with the wide bandgap-collector layer 38.

An i-Al$_x$Ga$_{1-x}$As breakdown-resistant collector layer 40 with thickness of 50 nm is formed on the wide-bandgap collector layer 38. On this breakdown-resistant collector layer 40 is formed an i-GaAs high electron mobility collector layer 42 with thickness of 150 nm. AlAs mole fraction x of the breakdown-resistant collector layer 40 varies from 0.25 to 0.00 continuously from the interface thereof with the wide bandgap-collector layer 38 to the interface thereof with the high electron mobility collector layer 42.

A p+-Al$_x$Ga$_{1-x}$As base layer 44 with thickness of 100 nm is formed on the high electron mobility collector layer 42. On the base layer 44 is formed an n-Al$_x$Ga$_{1-x}$As graded layer 45 with thickness of 50 nm. On the graded layer 45 is formed an n-Al$_{0.75}$Ga$_{0.25}$As emitter layer 46 with thickness of 150 nm. AlAs mole fraction x of the base layer 44 varies from 0.00 to 0.10 continuously from the interface thereof with the high electron mobility collector layer 42 to the interface thereof with the graded layer 45. AlAs mole fraction x of the graded layer 45 varies from 0.10 to 0.25 continuously from the interface thereof with the base layer 44 to the interface thereof with the emitter layer 46.

On this emitter layer 46 is formed an n+-GaAs cap layer 50 with thickness of 50 nm through an n+-Al$_x$Ga$_{1-x}$As graded layer 48 with thickness of 50 nm. AlAs mole fraction x of the graded layer 48 varies from 0.25 to 0.00 continuously from the interface thereof with the emitter layer 46 to the interface thereof with the cap layer 50.

Collector electrodes 52, base electrodes 54, and an emitter electrode 56 are provided respectively on the sub-collector layer 34, the base layer 44 and the cap layer 50.

Thus is formed an AlGaAs/GaAs HBT having a emitter made of AlGaAs, a base made of AlGaAs, and a collector made of GaAs and AlGaAs.

Next, the operation of this HBT will be explained with reference to FIG. 11.

Figure 11:
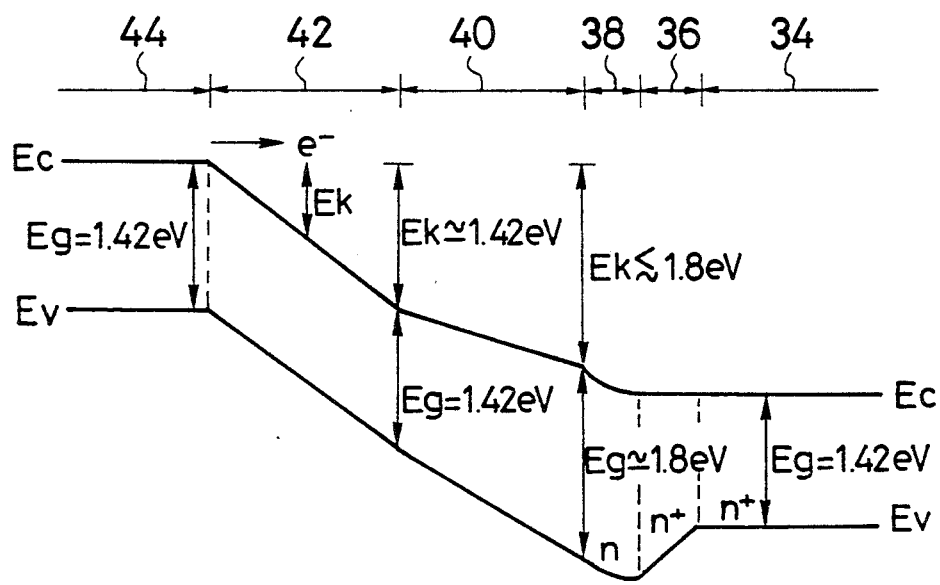
FIG. 11 is an energy band diagram for explaining the operation of the semiconductor device shown in FIG. 10.

FIG. 11 shows the energy band structure of the base-collector of the semiconductor device of FIG. 10 in operation.

The bandgap Eg of the the p+-AlGaAs base layer 44 is a gradually changing bandgap which decreases continuously from 1.55 eV at the graded layer 45 to around 1.42 eV at the interface thereof with the interface thereof with the high electron mobility collector layer 42 in accordance with the change of AlAs mole fraction. The bandgaps Eg of the i-GaAs high electron mobility collector layer 42 are 1.42 eV. The bandgap Eg of the i-AlGaAs breakdown voltage collector layer 40 is a gradually changing bandgap which increases continuously from 1.42 eV at the interface thereof with the high electron mobility collector layer 42 to around 1.80 eV at the interface thereof with the wide bandgap collector layer 38 in accordance with the change of mole fraction.

The bandgap Eg of the n-Al$_{0.75}$Ga$_{0.25}$As wide bandgap collector layer 38 is around 1.80 eV. The bandgap Eg of the n+Al$_x$Ga$_{1-x}$As graded layer 36 is a gradually changing bandgap which decreases continuously from around 1.80 eV at the interface thereof with the wide bandgap collector layer 38 to 1.42 eV at the interface thereof with the sub-collector layer 34 in accordance with mole fraction. The bandgap Eg of the n+-GaAs sub-collector 34 is 1.42 eV.

In the operational state with a required voltage applied between the base electrodes 54 and the collector electrodes 52, electrons are injected from the base layer 44 and flow toward the wide bandgap layer 38.

In the high electron mobility collector layer 42, the electrons flow at very high speed. But in the high electron mobility collector layer 42, the kinetic energy of the electrons is always lower than or substantially equal to the bandgap Eg=1.42 eV. Accordingly in the high electron mobility collector layer 42 the electrons flow at high speed without causing the avalanche breakdown.

Next, in the breakdown-resistant collector layer 40, its bandgap Eg increases continuously from 1.42 eV at the interface thereof with the high electron mobility collector layer 42 to around 1.80 eV at the interface thereof with the wide bandgap collector layer 38. Although kinetic energy of the electrons flowing in the breakdown-resistant collector layer 40 becomes gradually higher, the bandgap of the breakdown-resistant collector layer 40 is always higher than the kinetic enery of the electrons. Consequently the electrons flow in the breakdown-resistant collector layer 40 without causing the avalanche breakdown.

In this embodiment, because not only the base layer 44 but also the high electron mobility collector layer 42 are made of GaAs, electrons injected from the emitter layer 46 are allowed to flow at very high speed in the base layer 44 and the high electron mobility collector layer 42, and the bipolar transistor can be operative at high speed.

In the breakdown-resistant collector layer 40, the gradually changing bandgap Eg is continuously widened in the direction of flow of electrons. Its bandgap is higher at respective positions thereof than kinetic energy Ek of the electrons flowing there, which allows the electrons flowing in the breakdown-resistant collector layer 40 to flow therethrough without the avalanche breakdown. Consequently high breakdown-voltage of the collector can be realized.

A preferable thickness range of the high electron mobility collector layer 42 of the AlGaAs/GaAs HBT according to the third embodiment will be calculated by the same method as the HBT of the first embodiment.

A turn-on voltage Von of the AlGaAs/GaAs HBT is about 1.60 volts. The transistor Tr1 has Vbc=1.20–2.00 volts, the transistor Tr2 has Vbc=1.40–1.80 volts, and the transistor Tr3 has Vbc=0.00–0.40 volts. When the transistors Tr1, Tr2, and Tr3 turn on, Vbc is a maximum of 1.40 volts. When the transistors Tr1, Tr2, and Tr3 turn off, Vbc is a maximum of 2.00 volts.

When the HBT turns on, the thickness d of the high electron mobility collector layer 42 is given by $$\begin{aligned} d &= 300 \times 1.42 \times n/(1.525 + 1.40) \\ &= 145.6 \times n \\ &= 145.6 - 218.4 \end{aligned}$$

where a build-in voltage Vbi=1.525. When the HBT turns off, the thickness d of the high electron mobility collector layer 42 is given by $$\begin{aligned} d &= 300 \times 1.42 \times n/(1.525 + 2.00) \\ &= 120.9 \times n \\ &= 120.9 - 181.3. \end{aligned}$$

Thus the preferable thickness range of the high electron mobility collector layer 42 is 145.6–218.4 nm when the HBT turns on, or 120.9–181.3 nm when the HBT turns off.

In the first to third embodiments, both the breakdown-resistant collector layer 10, 11 or 40 and the high electron mobility collector layer 12 or 42 are formed to be i-type, but they may be p−-type or n−-type. Especially in the case of the p−-type, the band bending due to their doping further thickens the high electron mobility collector layer 12 or 42 enjoying high mobility. Consequently the speedup of the bipolar transistor can be further improved.

In the first and second embodiments, the base layer 14 and the high electron mobility collector layer 12 are made of InGaAs but may be made of, e.g., Ge, SiGe or others.

In the first to third embodiments, without the wide bandgap collector layer 8, 9 or 38, the basic advantageous effects of speedup and high breakdown-voltage can be achieved.

The HBT according to a fourth embodiment of the present invention will be explained in good detail using FIGS. 12 and 13.

Figure 12:
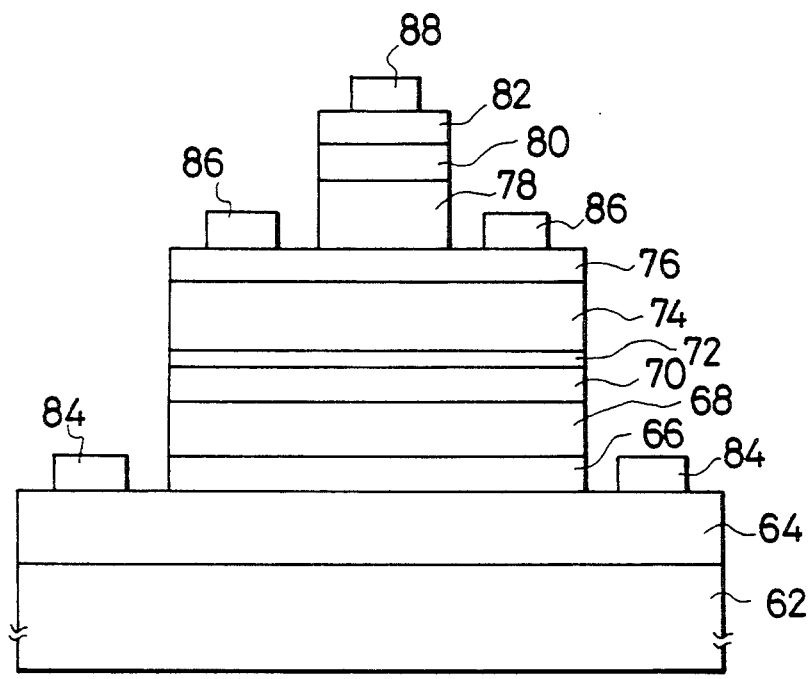
FIG. 12 is a sectional view of the HBT according to a fourth embodiment of this invention.

FIG. 12 shows a sectional view of the HBT according to the fourth embodiment.

An n+-InGaAs collector contact layer 64 with thickness of 300 to 500 nm is formed on an InP substrate 62. On the n+-InGaAs collector contact layer 64 are formed the following layers one on another in the sequence to be shown below; i.e., an n+-InGaAsP quaternary alloy graded layer 66 with thickness of 50 nm, an n+-InP wide bandgap collector layer 68 with thickness of 100 nm, a quaternary alloy n+-InGaAsP graded layer 70 with thickness of 50 nm, a p+-InGaAs planar doped layer 72 with thickness of 20 nm, an i-InGaAs narrow bandgap collector layer 74 with thickness of 200 nm, a p+-InGaAs base layer 76 with thickness of 50 to 100 nm, an n-InP emitter layer 78 with thickness of 200 nm, a quaternary alloy n+-InGaAsP graded layer 80, and an n+-InGaAs emitter contact layer 82 with thickness of 50 nm.

Collector electrodes 84, base electrodes 86, and an emitter electrode 88 are formed respectively on the n+-InGaAs collector contact layer 64, the p+-InGaAs base layer 76, and the n+-InGaAs emitter contact layer 82.

The quaternary alloy n+-InGaAsP graded layers 66, 70, 80 are $(InP)_x(InGaAs)_{1-x}$ where InP mole fraction x is varied from 1 to 0 or from 0 to 1.

The p-type impurity concentrations of the p+-InGaAs base layer 76 and the p+-InGaAs planar doped layer 72 are so set that a concentration difference between the two concentrations can generate an electric field which maximizes the velocity-overshoot of transiting electrons in the i-InGaAs narrow bandgap collector layer 74.

The n+-InGaAs collector contact layer 64 is for obtaining a low contact resitance. The quaternary alloy n+-InGaAsP graded layer 66 is for smoothly connecting the energy bands of the n+-InGaAs collector contact layer 64 and the n+-InP wide bandgap collector layer 68 so that no spike takes place in the conduction band of the junction therebetween.

The operation of the fourth embodiment will be explained with reference to FIG. 13.

Figure 13:
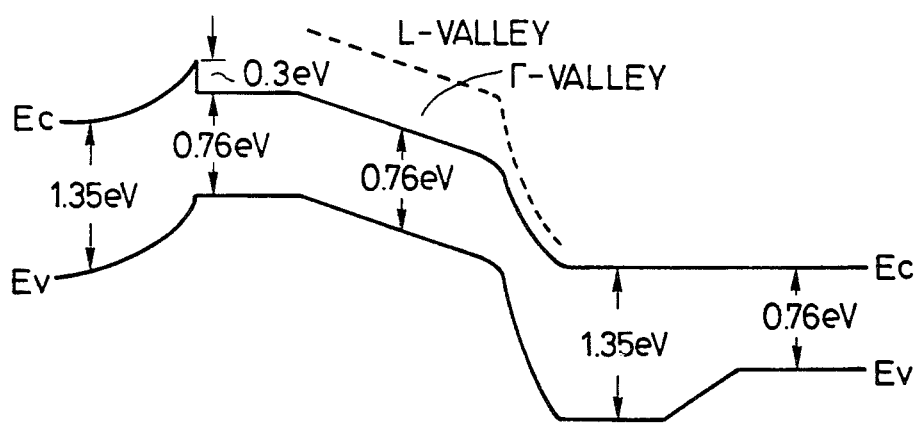
FIG. 13 is an energy band diagram for explaining the operation of the semiconductor device shown in FIG. 12.
Figure 13:
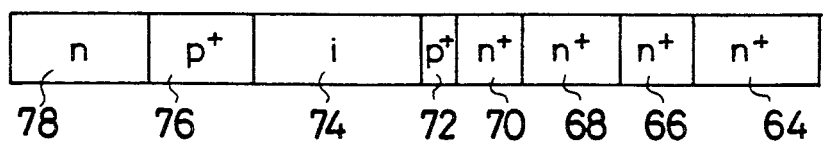

FIG. 13 is an energy bandgap structure of the HBT of FIG. 12.

The emitter-base junction between the n-InP emitter layer 78 and the p+-InGaAs base layer 76 is an abrupt junction, and an around 0.3 eV-spike is generated on the bottom of the conduction band Ec of the junction. Resultantly electrons injected from the n-InP emitter layer 78 to the p+-InGaAs base layer 76 have the hot electron effect and can transit at very high speed in the p+-InGaAs base layer 76.

A turn-on voltage, which is a voltage necessary to put this HBT turn on, is determined by the bandgap of the base layer. The bandgap of the p+-InGaAs base layer 76 is Eg=0.76 eV, which is lower in comparison with, e.g., the bandgap Eg=1.42 eV of GaAs. Consequently a low turn-on voltage can be obtained, and accordingly the operation with a low power consumptive operation can be realized. At the same time, the effective electron mass of InGaAs, which has a low bandgap, is small, and accordingly their characteristics of electron transport is quite good, which contributes to increasing transit speed of the electrons in the p+-InGaAs base layer 76 and their transit time in the base can be shortened.

The electrons which have been transiting at very high speed in the p+-InGaAs base layer are injected into the i-InGaAs narrow bandgap collector layer 74. The i-InGaAs narrow bandgap collector layer 74 as well as the p+-InGaAs base layer 76 has a narrow bandgap and, at the same time, an i-type layer of a low impurity. Accordingly the scattering due to impurities is very little. The electric field in the i-InGaAs narrow bandgap collector layer 74 is so optimized that the velocity overshoot of the electrons is maximized due to a p-type impurity concentration difference between the p+-InGaAs base layer 76 and the p+-InGaAs planar doped layer 72. Consequently the electrons velocity overshoot in the entire region of the i-InGaAs narrow bandgap collector layer 74 and can transit quasi-ballistically in the Γ-valley where the transit speed is higher.

Parts of the p+-InGaAs planar doped layer 72, the n+-InGaAsP quaternary alloy graded layer 70, and the n+-InP wide bandgap collector layer 68 are made depletion layers by the p+-n+ junction, with an intense electric field applied to. The electrons which have been transiting at ultra-high speed in the i-InGaAs narrow bandgap collector layer 74 enter this intense-field region. But the avalanche breakdown of the electrons can be prevented because the bandgap of the quaternary alloy n+-InGaAsP graded layer 70 changes and widened gradually from 0.76 eV to 1.35 eV, and the bandgap of the n+-InP wide bandgap collector layer 68 is as wide as 1.35 eV. Consequently a sufficient collector breakdown voltage can be obtained.

In these depletion layers, the electrons transit from the Γ-valley, where they have transited, to the L-valley. The distance over which the electrons transit in the L-valley is short because the width of the depletion layers do not widen because of high impurity concentrations of the n+-InGaAsP quaternary alloy graded layer 70 and the n+-InP wide bandgap collector layer 68. Consequently the depletion layers do not contribute much to the transit time.

Thus according to the fourth embodiment, the turn-on voltage can be decreased to make a low power consumptive operation possible, the transit time in the base and the collector can be reduced to make an ultra-high speed operation possible, and a sufficiently high breakdown-voltage for the operation of circuits can be obtained because of the following features: 1) a spike generated on the bottom of the conduction band of the emitter-base junction between the n-InP emitter layer 78 and the p+-InGaAs layer 76 produces the hot electron effect; 2) both the p+-InGaAs base layer 76 and the i-InGaAs narrow bandgap collector layer 74 have narrow bandgaps; 3) the i-InGaAs narrow bandgap collector layer 74, the p+-InGaAs planar doped layer 72 and the n+-InGaAsP quaternary alloy layer 70 constitute an i/p+/n+collector structure, and the electric field in the i-InGaAs narrow bandgap collector layer 74 is optimized by a concentration difference in p-type impurity concentration between the p+-InGaAs base layer 76 and the p+-InGaAs planar doped layer 72; 4) the n+-InGaAsP quaternary alloy graded layer 70 and the n+-InP wide bandgap collector layer 68 have gradually widened and sloped bandgaps for the prevention of the avalanche breakdown of electrons; and others.

In the above-described fourth embodiment, the p+-type planar doped layer is provided by the p+-InGaAs planar doped layer 72 made of InGaAs, whose bandgap is narrow, as is the p+-InGaAs layer 76, but may be provided by a graded layer made of the same quaternary alloy InGaAsP as the quaternary alloy n-InGaAsP graded layer 70.

That is, an InGaAsP quaternary alloy graded layer whose bandgap is sloped and gradually widened is formed between the i-InGaAs narrow bandgap collector layer 74 and the n+-InP wide bandgap collector layer 68. The part of the InGaAsP quaternary alloy graded layer at the junction with the i-InGaAs narrow bandgap collector layer 74 is doped with a p-type impurity to form a quaternary alloy p+-InGaAsP planar doped layer 72, and the remainder of the InGaAsP quaternary alloy graded layer at the junction with the n+-InP wide bandgap collector layer 68 is doped with an n-type impurity to form an quaternary alloy n+-InGaAsP graded layer whose bandgap is continuous with that of the quaternary alloy p+-InGaAsP planar doped layer.

This quaternary alloy p+-InGaAsP planer doped layer is depleted with an intense electric field applied to. For this reason, it is more preferable than the above-described embodiment, for the collector high breakdown voltage characteristic that the p+-InGaAsP quaternary alloy planer doped layer is a graded layer having a bandgap sloped and gradually widened.

In the above-described fourth embodiment, the collector layer contacting with the p+-InGaAs base layer 76 is provided by the i-InGaAs narrow bandgap collector layer 74, but it is not essential that the layer 74 is i-type and may be p-type or n-type. It is generally known that p-type is superior for the purpose of extending, at a low current density, the distance over which electrons transit in a Γ-valley for the speedup. But n-type is more preferable for the purpose of, at a high current density, preventing Kirk effect for the high speed operation. Otherwise, only the part of the collector layer neighboring the junction face of the p+-InGaAs base layer 76 is doped p-type or n-type, and the remaining most part thereof is doped i-type as in the above-described fourth embodiment to combine the advantages of both types.

The n-InP emitter layer 78 is not limited to InP and may be, e.g., an n-InAlAs emitter layer. The InP layers may be InAlAs layers, and the InGaAsP layers may be InAlGaAs layers.

In the above-described fourth embodiment, for the speedup, the p+-InGaAs base layer 76 and the i-InGaAs narrow bandgap collector layer 74 are made of InGaAs, whose bandgap is narrow. But in the case the breakdown voltage is given preference to the speedup, it is not essential to use a semiconductor material with a narrow bandgap, and GaAs, for example, may be used.

The above-described first to fourth embodiments have been explained by means of its application to the HBT, but this invention is not limited to the application to the HBT and is adaptable widely to bipolar-type transistors.

What is claimed is:

1. A semiconductor device capable of operating under a predetermined voltage, comprising:
   an emitter layer;
   a base layer of a first conductivity type formed in contact with the emitter layer having a first bandgap;
   a first collector layer formed in contact with the base layer, and having a second bandgap substantially equal to the first bandgap; and
   a second collector layer formed in contact with the first collector layer, and having a third bandgap wider than the second bandgap,
   wherein the first collector layer has characteristics including a thickness sufficient to cause carriers injected from the first conduction type base layer and flowing in the first collector layer under the predetermined voltage, to have a kinetic energy substantially equal to or higher than a bandgap at an interface between the first collector layer and the second collector layer and sufficient to not cause an avalanche breakdown.

2. A semiconductor device according to claim 1, wherein the kinetic energy sufficient to not cause an avalanche breakdown is substantially equal to or lower than 1.5 times the bandgap at the interface between the first collector layer and the second collector layer.

3. A semiconductor device according to claim 1, wherein the third bandgap widens gradually from the interface between the first collector layer and the second collector layer.

4. A semiconductor device according to claim 3, wherein the kinetic energy of the carriers is substantially 1.0 to 1.5 times the bandgap of the second collector layer at positions in the second collector layer.

5. A semiconductor device according to claim 1,
   wherein the bandgap of the second collector layer includes a maximum portion;
   wherein the second collector layer includes a concentration of an impurity; and
   wherein said semiconductor device further comprises a third collector layer of a second conductivity type formed in contact with the second collector layer, and having a fourth bandgap substantially equal to the maximum portion of the bandgap of the second collector layer, and doped with a higher concentration of an impurity than the concentration of the impurity of the second collector layer.

6. A semiconductor device according to claim 3,
   wherein the bandgap of the second collector layer includes a maximum portion;
   wherein the second collector layer includes a concentration of an impurity; and
   wherein said semiconductor device further comprises a third collector layer of a second conductivity type formed in contact with the second collector layer, and having a fourth bandgap substantially equal to the maximum portion of the bandgap of the second collector layer, and doped with a higher concentration of an impurity than the concentration of the impurity of the second collector layer.

7. A semiconductor device according to claim 4,
   wherein the bandgap of the second collector layer includes a maximum portion;
   wherein the second collector layer includes a concentration of an impurity; and
   wherein said semiconductor device further comprises a third collector layer of a second conductivity type formed in contact with the second collector layer, and having a fourth bandgap substantially equal to the maximum portion of the bandgap of the second collector layer, and doped with a higher concentration of an impurity than the concentration of the impurity of the second collector layer.

8. A semiconductor device according to claim 1, wherein the base layer and the first collector layer are made of InGaAs.

9. A semiconductor device according to claim 3, wherein the base layer and the first collector layer are made of InGaAs.

10. A semiconductor device according to claim 4, wherein the base layer and the first collector layer are made of InGaAs.

11. A semiconductor device according to claim 5, wherein the base layer and the first collector layer are made of InGaAs.

12. A semiconductor device according to claim 6, wherein the base layer and the first collector layer are made of InGaAs.

13. A semiconductor device according to claim 7, wherein the base layer and the first collector layer are made of InGaAs.

14. A semiconductor device according to claim 1, wherein the base layer and the first collector layer are made of GaAs.

15. A semiconductor device according to claim 3, wherein the base layer and the first collector layer are made of GaAs.

16. A semiconductor device according to claim 4, wherein the base layer and the first collector layer are made of GaAs.

17. A semiconductor device according to claim 5, wherein the base layer and the first collector layer are made of GaAs.

18. A semiconductor device according to claim 6, wherein the base layer and the first collector layer are made of GaAs.

19. A semiconductor device according to claim 7, wherein the base layer and the first collector layer are made of GaAs.

20. A semiconductor device capable of operating under a predetermined voltage, comprising:
an emitter layer;
a base layer of a first conductivity type formed in contact with the emitter layer having a first bandgap;
a first collector layer formed in contact with the first base layer, and having a second bandgap substantially equal to the first bandgap and having characteristics sufficient to cause carriers injected from the first base layer and flowing in the first collector layer under the predetermined voltage to have a kinetic energy lower than the second bandgap;
a second collector layer of a planer-doped first conductivity type formed in contact with the first collector layer, having a third bandgap, and having characteristics sufficient to cause carriers flowing in the second collector layer under the predetermined voltage to have a kinetic energy lower than the third bandgap; and
a third collector layer of a second conductivity type formed in contact with the second collector layer, and having a fourth bandgap higher than that of the first collector layer and having characteristics sufficient to cause carriers flowing in the third collector layer under the predetermined voltage to have a kinetic energy lower than the fourth bandgap.

21. A semiconductor device according to claim 20, wherein the first bandgap level of the base layer is lower than that of the emitter layer.

22. A semiconductor device according to claim 20, further comprising a fourth collector layer formed between the second collector layer and the third collector layer, and having a fifth bandgap widening gradually from an interface between the second collector layer and the fourth collector layer whereat the fifth bandgap of the fourth collector layer is smoothly connected to the fourth bandgap of the third collector layer.

23. A semiconductor device according to claim 20, wherein the third bandgap of the second collector layer is substantially equal to the second bandgap of the first collector layer.

24. A semiconductor device according to claim 22, wherein the third bandgap of the second collector layer is substantially equal to the second bandgap of the first collector layer.

25. A semiconductor device according to claim 20, wherein the third bandgap of the second collector layer widens gradually from the interface between the first collector layer and the second collector layer.

26. A semiconductor device according to claim 22, wherein the third bandgap of the second collector layer widens gradually from the interface between the first collector layer and the second collector layer.

27. A semiconductor device according to claim 20, wherein the base layer and the first collector layer are made of InGaAs.

28. A semiconductor device according to claim 22, wherein the base layer and the first collector layer are made of InGaAs.

29. A semiconductor device according to claim 23, wherein the base layer and the first collector layer are made of InGaAs.

30. A semiconductor device according to claim 24, wherein the base layer and the first collector layer are made of InGaAs.

31. A semiconductor device according to claim 25, wherein the base layer and the first collector layer are made of InGaAs.

32. A semiconductor device according to claim 26, wherein the base layer and the first collector layer are made of InGaAs.

* * * * *

UNITED STATES PATENT AND TRADEMARK OFFICE
CERTIFICATE OF CORRECTION

PATENT NO. : 5,150,185

DATED : September 22, 1992

INVENTOR(S) : YAMADA

It is certified that error appears in the above-indentified patent and that said Letters Patent is hereby corrected as shown below:

Cover page, under [56] References Cited, Foreign Patent Documents, list:

| | | |
|---|---|---|
| 0 278 386 | EPA | 2/88 |
| 0 273 363 | EPA | 12/87 |
| 0 097 767 | EPA | 3/83 |

Under [56] References Cited, Other Publications, include:

W.T. Tsang, A.F.J. Levi & E.G. Burkhardt- "GaInAs/GaInAsP/InP heterostructure bipolar transistors with very thin base (150 Å) grown by chemical beam epitaxy", Applied Physics Letters, 9/12/88, pp. 983-985.

Col. 1, line 55, change "electoric" to --electric--.

Col. 6, line 43, change "a" to --an--.

Col. 7, line 18, change "a" to --an--.

UNITED STATES PATENT AND TRADEMARK OFFICE
CERTIFICATE OF CORRECTION

PATENT NO. : 5,150,185
DATED : September 22, 1992
INVENTOR(S) : Yamada

It is certified that error appears in the above-indentified patent and that said Letters Patent is hereby corrected as shown below:

Col. 9, line 18, change "an" to --a--.

Signed and Sealed this

Twelfth Day of April, 1994

Attest:

BRUCE LEHMAN

Attesting Officer

Commissioner of Patents and Trademarks